United States Patent [19]

Kanazawa

[11] Patent Number: 4,653,822
[45] Date of Patent: Mar. 31, 1987

[54] ELECTRONIC APPARATUS WITH A BATTERY

[75] Inventor: Manabu Kanazawa, Tokyo, Japan

[73] Assignee: Canon Kabushiki Kaisha, Tokyo, Japan

[21] Appl. No.: 790,959

[22] Filed: Oct. 24, 1985

[30] Foreign Application Priority Data

Oct. 31, 1984 [JP] Japan ................................ 59-229193

[51] Int. Cl.⁴ .............................................. H01R 9/09
[52] U.S. Cl. .................................. 339/17 E; 361/401; 429/100
[58] Field of Search ................. 339/17 R, 17 C, 17 E; 429/96–100; 361/401

[56] References Cited

U.S. PATENT DOCUMENTS

| 2,407,145 | 9/1946 | Elwin | 29/832 |
| 3,473,966 | 10/1969 | Fritch | 429/100 |
| 4,054,938 | 10/1977 | Morris, Sr. | 361/401 |

Primary Examiner—Neil Abrams
Attorney, Agent, or Firm—Spencer & Frank

[57] ABSTRACT

An electronic apparatus having a battery as an electrical power supply and a battery chamber formed by a frame. A contact with the battery and an engaging member that engages with a portion of the frame are provided on a member engaged in the battery chamber. The engaging chamber and the portion of the frame receive the load of the battery. This arrangement provides adequate contact force even when the bottom of the battery chamber has an insufficient strength or when the battery chamber has no bottom plate, thereby allowing for a thin electronic apparatus.

13 Claims, 5 Drawing Figures

ELECTRONIC APPARATUS WITH A BATTERY

BACKGROUND OF THE INVENTION

1. Field of the Invention

The present invention relates to an electronic apparatus having a battery as an electrical power source, and more particularly to a comparatively thin electronic apparatus such as a compact computer, a calculator, a pocket radio, a tape recorder, a tester or a compact camera.

2. Description of the Prior Art

A conventional electronic apparatus having a battery as an electrical power source has a battery chamber which can hold a battery. A contact which contacts a battery held in said battery chamber is provided in that chamber. In such an electronic apparatus, there are mounted parts which ensure an adequate contact force, thereby preventing a contact failure and a short break caused by dimensional discrepancies in a battery or other parts.

FIG. 1 shows an example of an arrangement of a battery chamber in a conventional electronic apparatus. Reference numeral 1 denotes a battery lid disposed to cover the upper portion of a battery chamber 2. The battery lid 1 engages in a hole 3A formed in a rear case 3, and is secured to a synthetic resin frame 4. Reference numeral 5 denotes a battery housed in the battery chamber 2. Reference numeral 6 denotes a battery contact disposed between one electrode or a bottom of the battery 5 and a battery chamber bottom 2A, and further connected electrically to a printed circuit board 7. The battery 5 is pushed against the battery lid 1 by the elasticity of the contact 6, thereby ensuring an adequate contact force.

However, the load of the battery contact 6 is applied to the battery bottom chamber 2A. Consequently, the battery bottom chamber 2A must have sufficient strength to be able to bear the load of the battery contact 6. When, for instance, the electronic apparatus is thin and it is not possible to have an adequately thick battery chamber bottom 2A so that the strength of the battery chamber bottom 2A is insufficient, the battery chamber bottom 2A may deform in shape, and this may cause a contact fault or a short break because of an inadequate contact force.

SUMMARY OF THE INVENTION

It is, therefore, an object of the present invention to provide an electronic apparatus that ensures an adequate contact force even when a battery chamber bottom does not have an adequate strength or when such an electronic apparatus does not have a battery chamber bottom.

It is another object of the present invention to provide an electronic apparatus which is as thin as possible and has a thickness comparable to that of a battery.

It is a still further object of the present invention to provide an electronic apparatus having a construction whose assembly work is simple, and which has a very good workability.

In the first aspect of the present invention, an electronic apparatus having a battery as an electrical power source, comprises:

a holding member having an indented portion and flange members extending outwardly from the opening of the indented portion toward opposite sides, the indented portion accommodating and holding the battery;

a contact disposed on the bottom of the indented portion for contacting one electrode of the battery; and a frame having an opening for receiving the holding member and a portion engaged with the flange members on a surface of a circumference of the opening to support the flange members.

Here, the indented portion and the flange members may integrally be formed by bending a plate-like material. The holding member may be a conductive member connected electrically to the contact to supply electrical power from the battery through the contact and the holding member. The contact can be a member formed by cutting out at least one portion of the bottom of the holding member.

The bottom of the opening formed in the frame can be opened or closed.

In the second aspect of the present invention, an electronic apparatus having a battery as an electrical power source, comprises:

means for holding the battery, having a plurality of flange members around an outer periphery of the opening end of an indented member having a substantially U-shaped cross section and for accommodating the battery, and a protrusion formed inside of the closed end of the indented member; and means for supporting the holding means by the plurality of flange members.

Here, the indented member and the flange members of the holding means may be formed by bending a plate-like member.

The protrusion of the holding means can be formed by partially cutting out and protruding the cut portion from the closed end of the indented member.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 1:
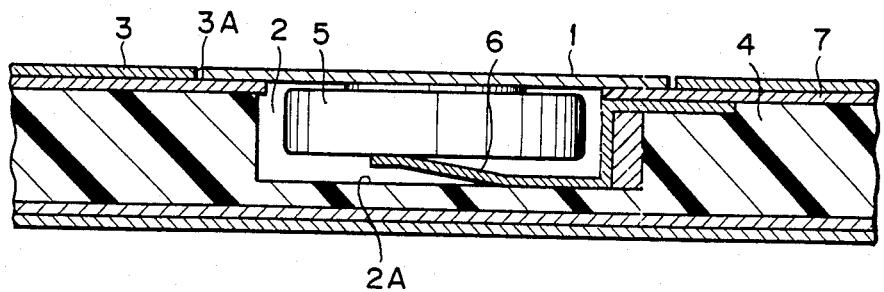
FIG. 1 is a cross-sectional view showing an example of an arrangement of the principle parts in a conventional electronic apparatus having a battery as an electrical power source.
Figure 2:
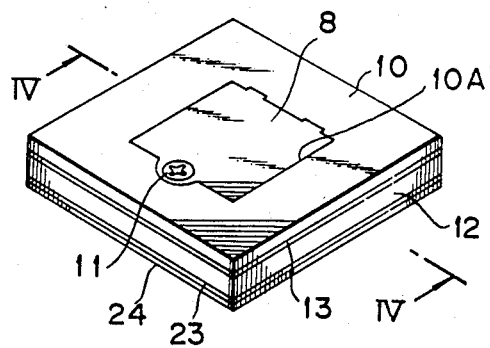
FIG. 2 is a perspective view of an embodiment of an arrangement of the principle parts in an electronic apparatus having a battery as an electrical power source according to the present invention.
Figure 3:
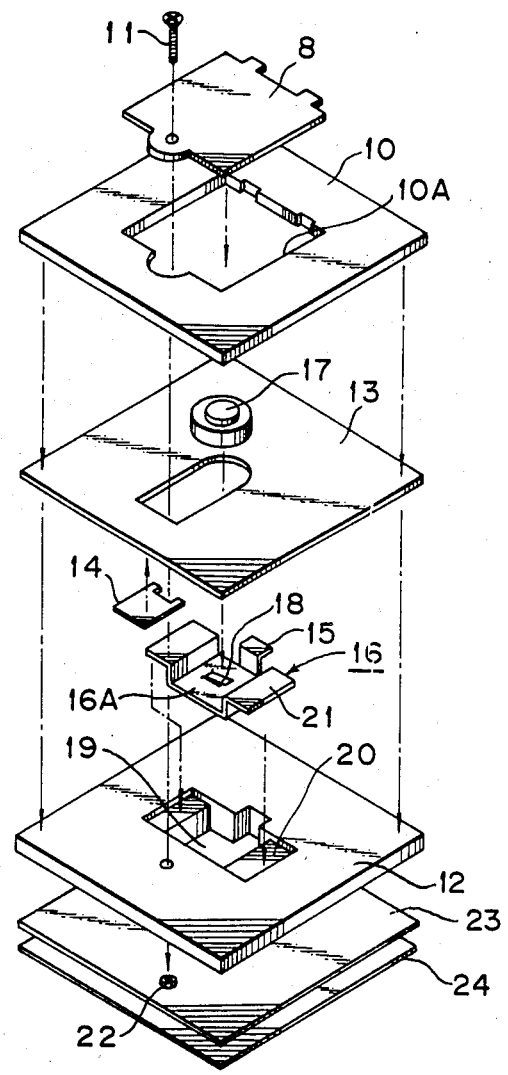
FIG. 3 is an expanded view showing the electronic apparatus shown in FIG. 2.
Figure 4:
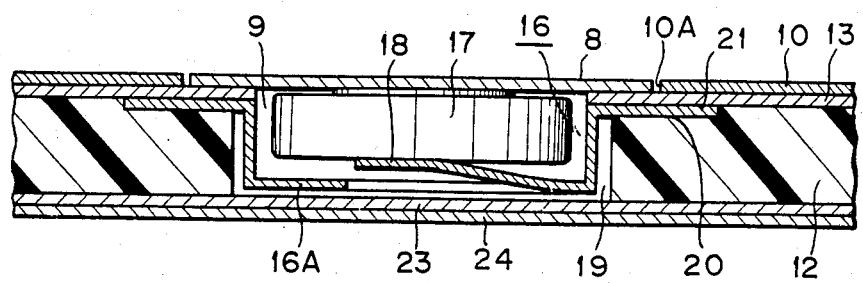
FIG. 4 is a cross-sectional view taken along line IV—IV in FIG. 2.

FIGS. 2, 3 and 4 show an embodiment of the present invention. Reference numeral 8 in FIGS. 2, 3 and 4 denotes a battery lid disposed on an upper part of a battery chamber 9. The battery lid 8 is engaged in a hole 10A formed in a rear case 10, and at the same time, is fixed by a screw 11 to a frame 12 made from, for instance, synthetic resin. A printed circuit board 13 is disposed between the frame 12 and the rear case 10. A negative contact 14 and a positive contact connecting member 15 are connected electrically to this printed circuit board 13.

The positive contact connecting member 15 is formed integrally with a positive contact or holding member 16 as shown in detail in FIG. 3. This positive contact member 16 is bent into a substantially indented shape to form a recess so that a battery 17 can fit inside the recess of the positive contact member 16. A portion of the bottom 16A of the positive contact member 16, that is, the portion which contacts the bottom side electrode of the battery 17, is cut out and protrudes upwards thereby forming a positive contact 18 so that the positive contact is connected electrically to the bottom side electrode of the battery 17. The positive contact member 16 has engaging members 21 in the form of flanges extending outwardly from the wall of the recess of the contact member 16 toward the opposite directions.

A frame hole 19 is formed in the frame 12 so as to hold the positive contact 16. Frame engaging portions 20 are formed in the form of a recessed step on both sides of the frame hole 19, so that the engaging members 21 of the positive contact member 16 are engaged in the frame engaging portions 20. Reference numeral 22 denotes a nut which screws onto the screw 11. Reference numeral 23 denotes an adhesive layer, and reference numeral 24 denotes a film. The film 24 is adhered to the frame 12 by the adhesive layer 23. These portions can be arranged substantially the same as in a conventional apparatus.

When assembling the battery chamber 9, the negative contact 14 and the positive contact member 16 are mechanically connected to the printed circuit board 13, while electrical contact is ensured between the contact 14 and the printed circuit board 13 and between the contact member 16 and the printed circuit board 13. Then, the positive contact member 16 is inserted into the frame hole 19 in the frame 12 and the printed circuit board 13 is mounted on the upper surface of the frame 12. Next, the rear case 10 and the battery lid 8 are attached to the upper surface of the printed circuit board 13, and then the film 24 is adhered to the bottom side of the frame 12 with the adhesive 23. In this manner, the battery chamber 9 is assembled.

As a result, the positive contact member 16 is connected electrically to the printed circuit board 13 by the positive contact connecting member 15, and also to the battery 17 by the positive contact 18. In this condition, the engaging member 21 of the positive contact member 16 engages with the frame engaging portion 20 of the frame 12. Consequently, the frame engaging portion 20 bears the contact load. According to this arrangement, the bottom of the battery chamber 9 does not bear the contact load, contrary to a conventional arrangement, so that even if a hole such as the frame hole 19 is formed in the frame 12, there is no problem as in a conventional arrangement in which the frame must bear the contact load. Furthermore, since the positive contact member 16 is bent into an indented shape, the strength of the contact member 16 is also reinforced, so that the positive contact member 16 is not likely to be deformed.

Figure 5:
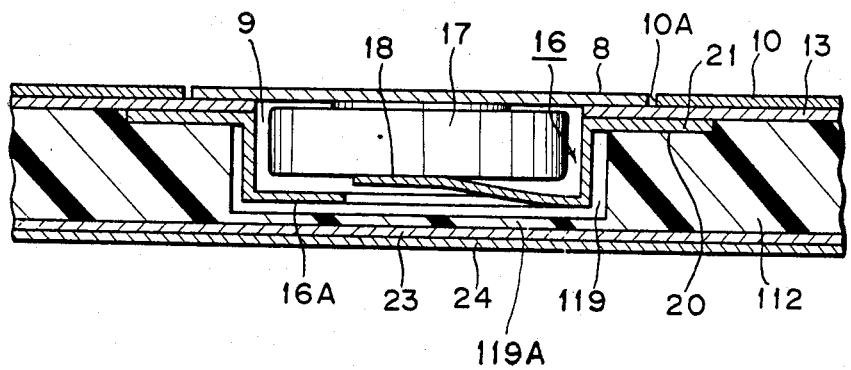
FIG. 5 is a cross-sectional view showing an embodiment of another arrangement of the principal parts in an electronic apparatus having a battery as an electrical power source according to the present invention.

FIG. 5 shows another embodiment of the present invention.

In this embodiment, reference numeral 112 denotes a frame corresponding to the frame 12 in FIGS. 3 and 4. Unlike the frame 12, this frame 112 does not have a through hole such as the frame hole 19 but has a recess 119 having a thin bottom portion 119A at the position corresponding to the frame hole 19. In other words, if the thin bottom portion 119A of the recess 119 is removed, this bottom-removed-recess corresponds to the frame hole 19. In this embodiment, the remaining structures is similar to those in FIGS. 3 and 4.

In this embodiment, the bottom portion 119A of the battery chamber 9 is thin, but this thin bottom portion 119A does not bear the contact load. The contact load is borne by the engaging portion 20 of the frame 112, so that no problem arises with respect to the thin bottom portion 119A, unlike a conventional arrangement.

While in the above arrangements, the positive contact 18 is cut out of and protrudes from the bottom of the positive contact member 16, in the integral form with the bottom of the positive contact member 16, a contact element in the form of, for example, a separate spring can also be disposed on the bottom of the contact member 16.

Furthermore, in the above arrangements, the electrical power is supplied from the battery 17 through the positive contact 18, the positive contact member 16 and the contact connecting member 15, but a lead wire or other conducting member for connecting the positive contact 18 to the printed circuit board 13 may also be used. When such conducting member is used, the members 15 and 16 need not be conductive members, and can be made from plastic material.

Furthermore, although the members 15, 16 and 18 in the above arrangements are connected to the positive side terminal of the battery 17, these members can also be connected to the negative side terminal of the battery 17, as a matter of course. In addition, it is clear that the above members can be of different shapes depending on the shape of a battery used.

As explained above, an electronic apparatus according to the present invention is arranged so that a load of the battery contact is borne by the frame engaging portion and not by the bottom of the battery chamber. As a result, even if, for example, the bottom of the battery chamber is not designed to receive a sufficient strength, or has a hole opened in it, adequate contact pressure can be provided. Moreover, since the bottom of the battery chamber in the present invention does not need to be thick, the thickness of the apparatus itself can be designed close to the thickness of the battery, allowing for a more thin and compact design. Furthermore, assembly of an apparatus according to the present invention involves inserting the contact member in the battery chamber of the frame, and then assembling a printed circuit board, the rear case, the battery lid and so on in order from the top, so that assembly work can be completed easily and simply, thereby contributing to improve the workability of the assembly.

What is claimed is:

1. An electronic apparatus having a battery as an electrical power source, comprising:
 a conductive holding member having an indented portion and flange members extending outwardly, in opposite directions, from an opening formed by said indented portion, said indented portion accommodating and holding said battery, the indented portion and said flange member being integrally formed by bending a plate-like material;
 a contact disposed on the bottom of said indented portion for contacting one electrode of said battery; and a frame having an opening for receiving said holding member and a portion engaged with said flange members on a surface of the perimeter of said opening to support said flange members, said conductive holding member being connected electrically to said contact to supply electrical power from said battery through said contact and said holding member.

2. An electronic apparatus having a battery as an electrical power source as claimed in claim 1, wherein said contact is a member formed by cutting out at least one portion of said bottom of said holding member.

3. An electronic apparatus having a battery as an electrical power source, comprising:
   a conductive holding member having an indented portion and flange members extending outwardly, in opposite directions, from an opening formed by said indented portion, said indented portion accommodating and holding said battery;
   a contact disposed on the bottom of said indented portion for contacting one electrode of said battery; and
   a frame having an opening for receiving said holding member and a portion engaged with said flange members on a surface of the perimeter of said opening to support said flange members, said conductive holding member being connected electrically to said contact to supply electrical power from said battery through said contact and said holding member.

4. An electronic apparatus having a battery as an electrical power source as claimed in claim 3, wherein said contact is a member formed by cutting out at least one portion of said bottom of said holding member.

5. An electronic apparatus having a battery as an electrical power source, comprising:
   a holding member formed from plate-like material, said plate-like material having a rectangular bottom portion, first and second upstanding sides extending from opposite ends of said bottom portion and first and second flanges extending outwardly from said first and second parallel sides respectively, the battery being supported on said rectangular bottom portions and between said first and second upstanding sides;
   a contact disposed on the rectangular bottom portion of said holding member for contacting one electrode of said battery; and
   a frame having an opening therein for receiving said holding member, said frame further having a portion engaged with said flange members along the periphery of said opening for supporting said flange members.

6. An electronic apparatus having a battery as an electrical power source as claimed in claim 5, wherein said rectangular bottom portion, upstanding sides and flange members are integrally formed by bending said plate-like material.

7. An electronic apparatus having a battery as an electrical power source as claimed in claim 5, wherein the bottom of the opening formed in said frame is open.

8. An electronic apparatus having a battery as an electrical power source as claimed in claim 5, wherein the bottom of the opening formed in said frame is closed.

9. An electronic apparatus having a battery as an electrical power source, comprising:
   means for holding said battery, said means including
      an indented member having a substantially U-shaped cross-section, said indented member having a closed rectangular bottom portion and being open at the top thereof;
      a plurality of flange members attached to said indented member, said flange members being located around the periphery of the open top of said indented member; and
      a protruding member projecting from the bottom portion of said indented member, said protruding member contacting one electrode of said battery; and
   means for supporting said holding member by said plurality of flange members.

10. An electronic apparatus having a battery as an electrical power source as claimed in claim 9, wherein said indented member and said flange members of said holding means are formed by bending a plate-like member.

11. An electronic apparatus having a battery as an electrical power source as claimed in claim 9, wherein said protrusion of said holding means is formed by partially cutting out a portion and protruding the cut portion from said closed end of said indented member.

12. An electronic apparatus having a battery as an electrical power source as claimed in claim 10, wherein said protrusion of said holding means is formed by partially cutting out a portion and protruding the cut portion from said closed end of said indented member.

13. An electronic apparatus having a battery as an electrical power source, comprising
   a frame having an aperture therein, first and second sides and a plurality of engaging portions along the edges of said aperture;
   a positive contact member for holding said battery positioned within the aperture in said frame, said positive contact member including
      a U-shaped portion having a closed bottom member, said U-shaped portion being open at the top;
      a plurality of flange members, attached to said U-shaped portion, located around the periphery of the open top of said U-shaped portion, said flange members being supported by the engaging portions of said frame; and
      a protruding member projecting from said bottom member for electrically contacting one electrode of said battery;
   a printed circuit board having first and second sides, said first side being secured to the second side of said frame, a positive contacting member electrically connecting said printed circuit board to said positive contact member;
   a case member secured to the second side of said printed circuit board; and
   a film secured to the first side of said frame, the battery contact load in said electronic apparatus being supported by said frame.

* * * * *